(12) United States Patent
Sneelal et al.

(10) Patent No.: US 7,091,092 B2
(45) Date of Patent: Aug. 15, 2006

(54) PROCESS FLOW FOR A PERFORMANCE ENHANCED MOSFET WITH SELF-ALIGNED, RECESSED CHANNEL

(75) Inventors: Sneedharan Pillai Sneelal, Trivandrum (IN); Francis Poh, Singapore (SG); James Lee, Singapore (SG); Alex See, Singapore (SG); C. K. Lau, Singapore (SG); Ganesh Shankar Samudra, Singapore (SG)

(73) Assignees: Chartered Semiconductor Manufacturing Ltd., Singapore (SG); National University of Singapore, Singapore (SG)

( * ) Notice: Subject to any disclaimer, the term of this patent is extended or adjusted under 35 U.S.C. 154(b) by 1108 days.

(21) Appl. No.: 10/062,227

(22) Filed: Feb. 5, 2002

(65) Prior Publication Data
US 2002/0094622 A1    Jul. 18, 2002

Related U.S. Application Data

(62) Division of application No. 09/671,509, filed on Sep. 27, 2000, now Pat. No. 6,391,720.

(51) Int. Cl.
*H01L 21/336* (2006.01)

(52) U.S. Cl. .............. 438/268; 438/270; 438/243; 438/421; 257/330; 257/301; 257/396

(58) Field of Classification Search ............. None
See application file for complete search history.

(56) References Cited

U.S. PATENT DOCUMENTS

| 5,270,228 | A |   | 12/1993 | Ishikawa |
|-----------|---|---|---------|----------|
| 5,599,728 | A |   | 2/1997  | Hu et al. |
| 5,610,090 | A |   | 3/1997  | Jo |
| 5,814,544 | A |   | 9/1998  | Huang ............... 438/291 |
| 6,358,800 | B1 | * | 3/2002  | Tseng ................ 438/268 |

* cited by examiner

*Primary Examiner*—Dung A. Le
(74) *Attorney, Agent, or Firm*—Saile Ackerman LLC; Stephen B. Ackerman; Rosemary L. S. Pike

(57) ABSTRACT

A method for forming a self-aligned, recessed channel, MOSFET device that alleviates problems due to short channel and hot carrier effects while reducing inter-electrode capacitance is described. A thin pad oxide layer is grown overlying the substrate and a gate recess, followed by deposition of a thick silicon nitride layer filling the gate recess. The top surface is planarized exposing the pad oxide layer. An additional oxide layer is grown, thickening the pad oxide layer. A portion of the silicon nitride layer is etched away and additional oxide layer is again grown. This forms a tapered oxide layer along the sidewalls of the gate recess. The remaining silicon nitride layer is removed. The oxide layer at the bottom of the gate recess is removed and a gate dielectric layer is grown. Gate polysilicon is deposited filling the gate recess. S/D implantations, metallization, and passivation complete fabrication of the device.

28 Claims, 6 Drawing Sheets

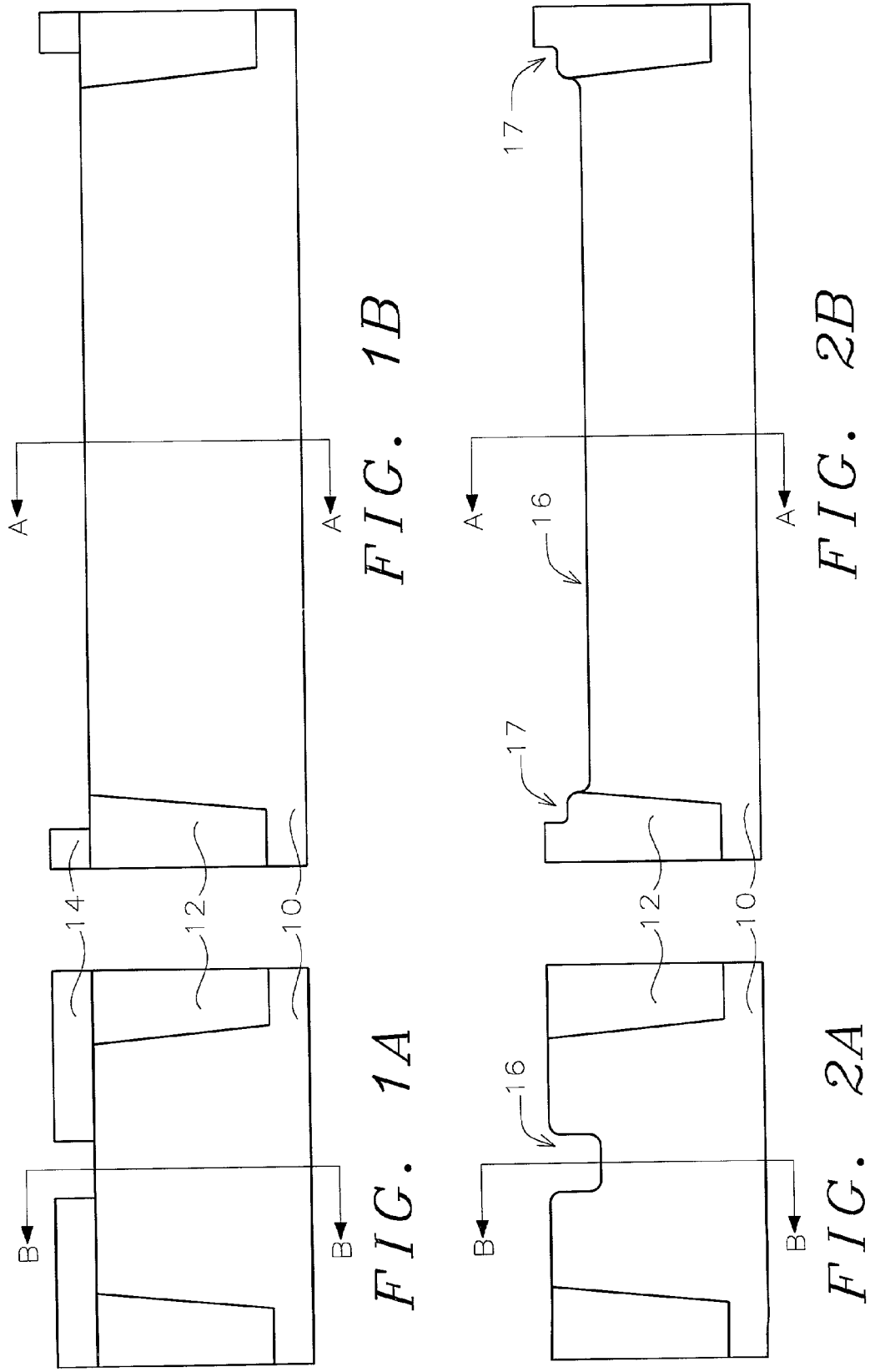

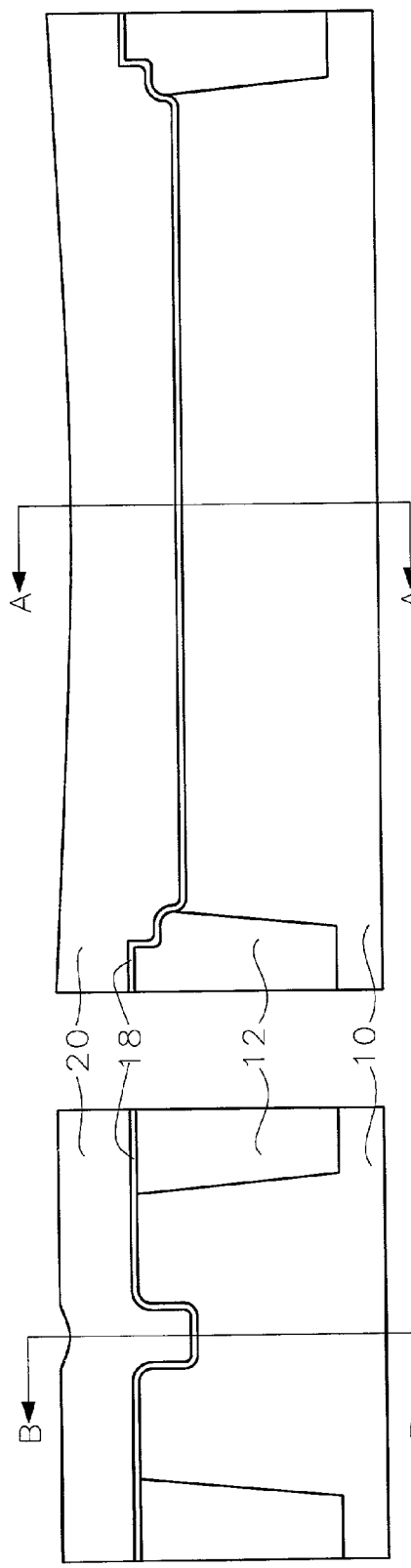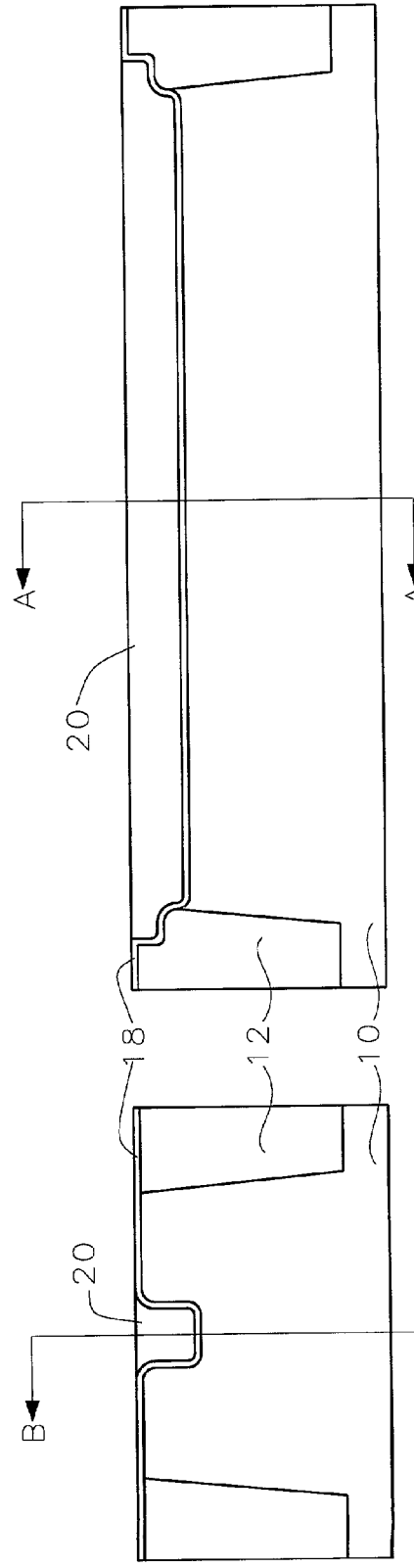

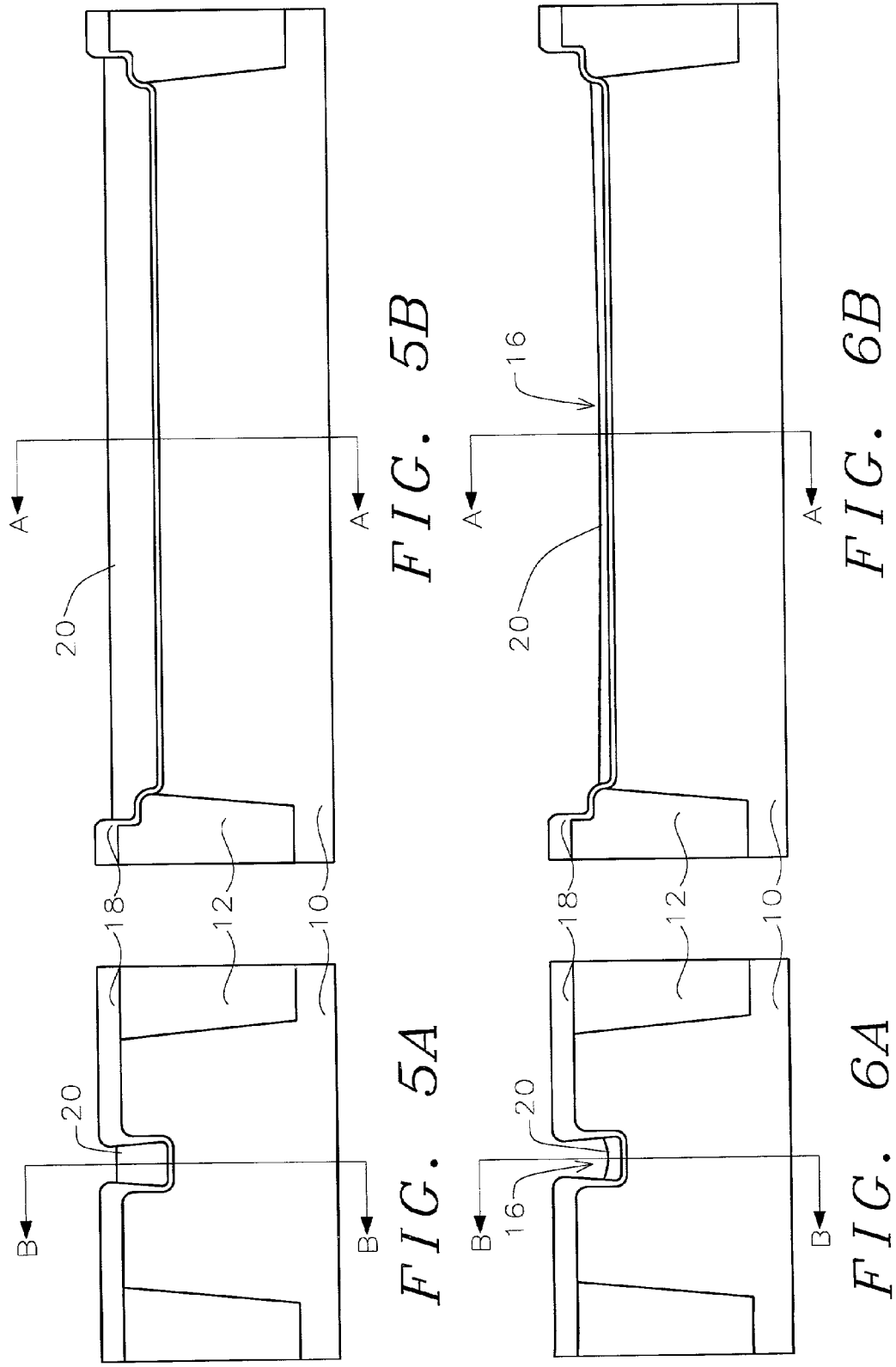

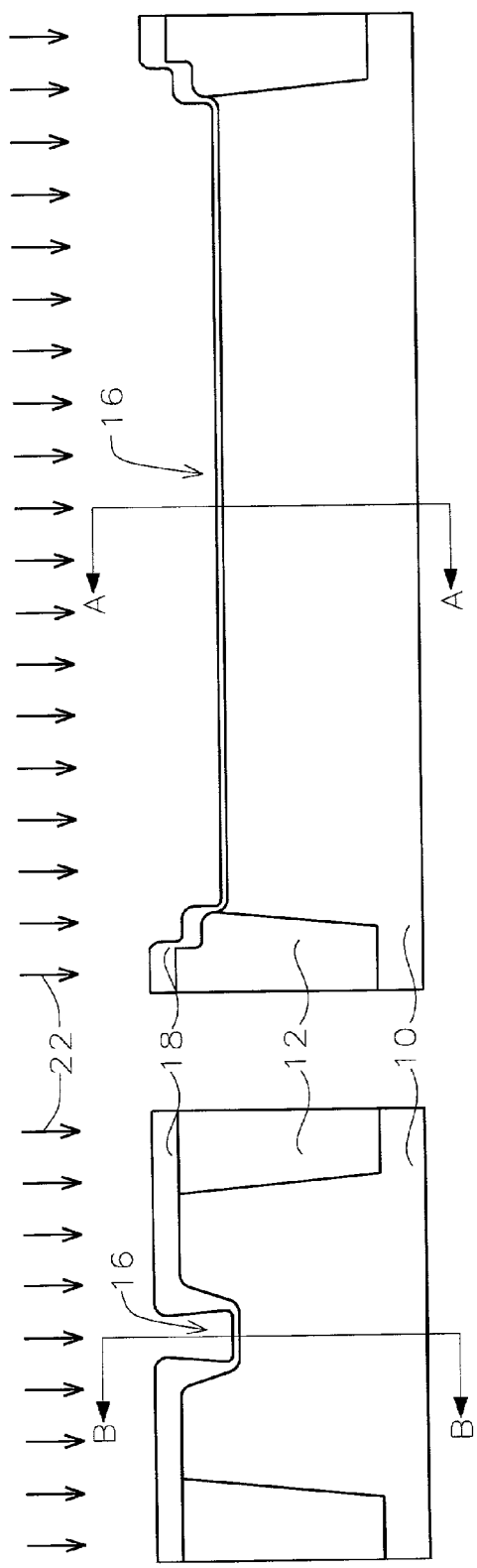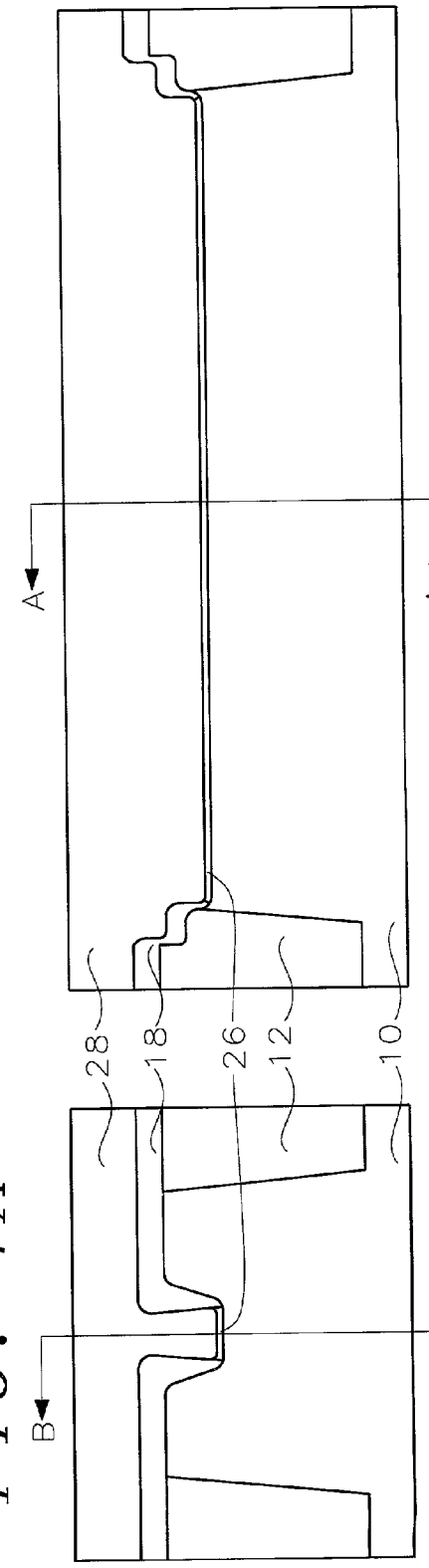

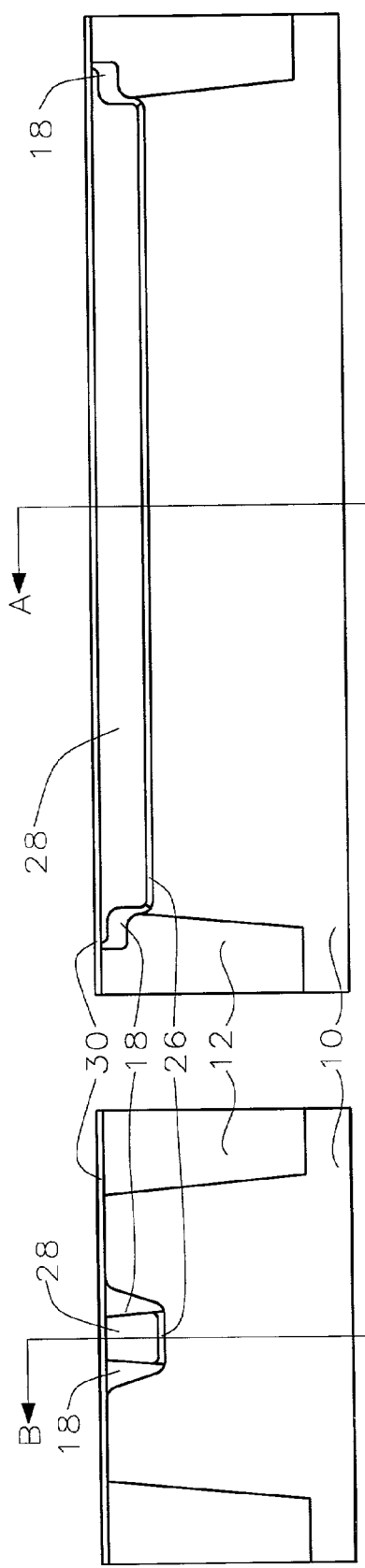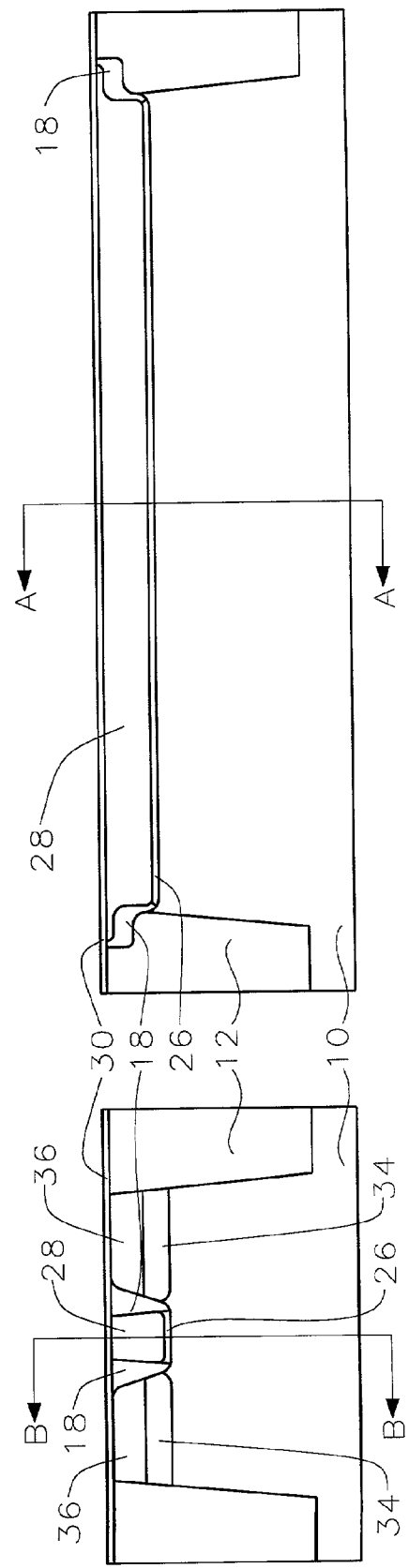

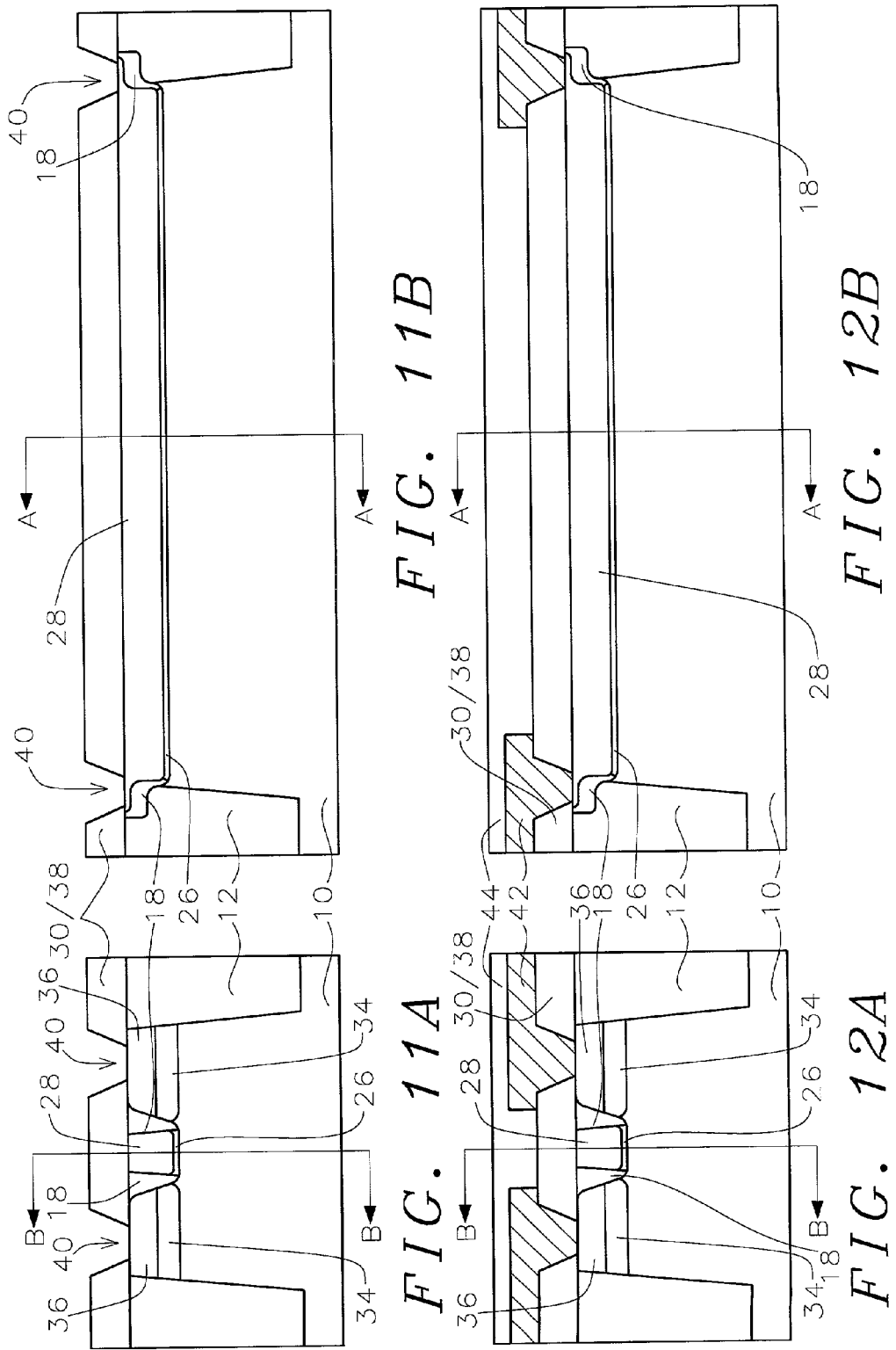

PROCESS FLOW FOR A PERFORMANCE ENHANCED MOSFET WITH SELF-ALIGNED, RECESSED CHANNEL

This application is a DIV of Ser. No. 09/671,509 Sep. 27, 2002, U.S. Pat. No. 6,391,720.

BACKGROUND OF THE INVENTION (1) Field of the Invention

The invention generally relates to a method of fabricating a semiconductor device and, more particularly, to a method of fabricating a field-effect transistor (FET) having a recessed gate structure in the manufacture of integrated circuits.

(2) Description of Prior Art

A device prevalent in high-speed integrated circuits is the so-called metal-oxide-semiconductor field effect transistor (MOSFET). A MOSFET comprises three electrodes: a source, a drain and a gate. The heavily doped source and drain (S/D) regions are separated by a lightly doped channel. If the S/D are n-type material, then the channel is p-type and the device is an NMOS transistor. Conversely, if the S/D are p-type material, then the channel is n-type and a PMOS transistor results. The gate electrode is positioned over, but electrically insulated from the channel. By applying a voltage to the gate electrode, the conductivity of the channel is affected, thus a voltage on the gate can control the current between the source and drain. By implanting dopant ions into the channel, the threshold or "turn-on" gate voltage can be tailored to the required level.

As integrated circuit device dimensions are reduced, parasitic effects become a challenge. In MOSFET devices, as the distance between the source and drain (channel length) is reduced, punch-through, hot-carrier effect, and interelectrode capacitance become factors that degrade performance.

As the channel length is decreased, a voltage applied to the drain electrode can result in conduction between the source and drain without a voltage applied to the gate. This punch-through effect reduces the control the gate electrode has over the drain current. Typically, a punch-through implantation is performed (along with the threshold adjust implantation) prior to formation of any of the gate structure to counter the effects of the short channel.

To reduce the hot carrier effect, the S/D regions are formed with two dopant levels. Typically, lightly doped S/D regions are formed by ion implantation using the gate as a mask. This is followed by the formation of gate sidewall spacers to, in effect, widen the gate mask. This is followed by a second more heavily doped S/D implantation. The presence of a lightly doped S/D concentration near the gate electrode minimizes the hot carrier effect. Alternately, a lightly doped envelope for the heavily doped S/D junctions may be formed by a faster diffusing dopant ion implantation with a lower dose, followed by a heavy ion implantation at a higher dose.

Capacitance between the drain and substrate is inversely proportional to the width of the depletion region between them. For a specific S/D dopant concentration, the depletion region width decreases as the substrate dopant concentration increases. Thus, as the punch-through implantation increases the substrate dopant concentration, the depletion region width shrinks, and the drain capacitance increases. This increase in drain capacitance limits the speed at which the device and the integrated circuit will switch.

One method of reducing the aforementioned parasitic effects is to use a device with a recessed channel. The recessed channel reduces punch-through, and in some cases, the punch-through implantation step is eliminated and capacitance is reduced. Several methods of forming recessed channels have been described. U.S. Pat. No. 5,814,544 to Huang teaches a method of forming a recessed channel where a silicon nitride layer with a gate opening is patterned. Mask oxide is then grown in the exposed gate opening consuming some of the silicon. The S/D implantation is performed using the mask oxide in the gate opening as a mask. The oxide is then removed leaving a recessed channel area. U.S. Pat. No. 5,599,728 to Hu et al. teaches a method of forming a recessed gate by forming a trench in a silicon nitride spacer. A wet oxidation is performed creating the recessed gate. U.S. Pat. No. 5,610,090 to Jo teaches a method incorporating reactive ion etching (RIE) to form a non-symmetrical recessed gate. U.S. Pat. No. 5,270,228 to Ishikawa teaches a method of forming a two-level recessed gate using a single lithographic and etch step.

SUMMARY OF THE INVENTION

A principal object of the present invention is to provide a method for forming a self-aligned, recessed channel, MOSFET device.

A second object of the present invention is to provide a method for forming a self-aligned, recessed channel, MOSFET gate electrode.

Another object of the present invention is to provide a method for forming a self-aligned, recessed channel, MOSFET device that alleviates the problems due to short channel effects, including punch through, hot carrier effect and increased inter-electrode capacitance.

Another object of the present invention is to provide a method for forming a self-aligned, recessed channel, MOSFET gate electrode that alleviates the problems due to short channel effects, including punch through, hot carrier effect and increased inter-electrode capacitance.

These objects are achieved using a process where the gate structure of a MOSFET, comprising a gate dielectric covered by a gate electrode, is formed in a recess in the substrate. A substrate with an active area encompassed by a shallow trench isolation (STI) region is provided. A mask oxide layer is then patterned and etched using photolithographic techniques to expose the substrate and a portion of the STI region. The surface is etched in the active area and the mask oxide layer is eroded away while forming a gate recess in the unmasked area. The exposed portion of the STI region will also be etched.

A thin pad oxide layer is grown overlying the surface followed by deposition of a thick silicon nitride layer covering the surface and filling the gate recess. The top surface is then planarized exposing the pad oxide layer. Additional oxide is grown causing the pad oxide layer to thicken. A portion of the silicon nitride layer is etched away and additional oxide is grown causing the pad oxide layer to further thicken. This forms a tapered oxide layer along the sidewalls of the gate recess. The remaining silicon nitride layer is then removed, re-opening the gate recess. A threshold adjust and punch-through implantation is performed into the substrate below the gate recess. The tapered oxide layer on the gate recess sidewalls protects the implantation from reaching areas laterally outside the forthcoming gate structure. Next, the pad oxide layer is isotropically etched to remove the oxide at the bottom of the gate recess. A gate dielectric is then grown in the bottom of the gate recess. This is followed by a deposition of gate polysilicon covering the top surface and filling the gate recess. The top surface is again planarized to expose the top of the substrate. This completes the formation of the recessed gate structure.

To complete the formation of the transistor and make interconnections, a screen oxide layer is deposited followed by light and heavy dose implantations for double implanted drain (DID), and annealing. An inter-electrode dielectric layer is deposited covering the top surface. Contact holes are then patterned in the dielectric layer. A metalization layer is deposited overlying the surface and filing the contact holes. The metalization layer is then patterned and a passivation layer is deposited completing the fabrication and interconnection of the MOS transistor device.

BRIEF DESCRIPTION OF THE DRAWINGS

In the accompanying drawings forming a material part of this description, there is shown:

FIG. 1 through FIG. 12 showing schematically in cross section one embodiment of the method of the present invention. FIG. 1a through FIG. 12a depict a side view while FIG. 1b through FIG. 12b show a lateral view.

DESCRIPTION OF THE PREFERRED EMBODIMENTS

This embodiment describes formation of a 100 nm recessed gate electrode in an n-channel (NMOS) or p-channel (PMOS) transistor. It will be understood by those skilled in the art that the invention can be extended to the formation of gate electrode structures of different sizes on a semiconductor wafer.

Referring now to FIG. 1 through FIG. 12, depicting schematically one embodiment of the present invention. Cut line "a" corresponds to each respective side view in FIG. 1a through FIG. 12a. Cut line "b" on each of the figures corresponds to each respective lateral side view shown in FIG. 1b through FIG. 12b.

Refer now more particularly to FIG. 1 where a partially formed MOS transistor is represented. A substrate 10 with a <100> crystal orientation, for example, is provided. For an NMOS device, the substrate 10 is composed of p-type silicon; for a PMOS device, the substrate 10 is composed of n-type silicon. Shallow trench isolation (STI) regions 12 comprised of silicon oxide are provided as is standard in the art to a depth of between about 300 and 500 nm. A mask oxide layer 14 composed of silicon oxide is grown on the surface using conventional techniques. The mask oxide layer 14 is then patterned and etched using photolithographic techniques to yield the pattern shown. This exposes the substrate 10 and a portion of the STI region 12. The mask oxide layer 14 thickness is determined by the etch selectivity of the silicon substrate 10 to the mask oxide 14. The thickness ($t_{ox}$) of mask oxide layer 14 is given by the equation:

$$t_{ox} = \frac{100 \text{ nm}}{(\text{Etch\_Selectivity})} +/- 5\%.$$

Thus if, for example, the etch selectivity of the silicon substrate to the mask oxide is two (2) (indicating that the etch process will etch the substrate twice as fast as mask oxide), then the mask oxide layer 14 thickness ($t_{ox}$) would be between 47.5 and 52.5 nm (50 nm nominal).

Referring now to FIG. 2, the surface is anisotropically etched using a $SF_6$ based chemistry of $SF_6/O_2$, $SF_6/C_2Cl_3F_3$, $SF_6/CHF_3$, or $SF_6/HBr$, for example. Using the etch selectivity scheme described previously, the mask oxide layer 14 will be eroded away while creating a gate recess 16 in the area of substrate 10 not protected by the mask oxide layer 14. The gate recess 16 will have a final depth of between about 95 to 105 nm (100 nm nominal). Once the mask oxide layer 14 is completely removed, the substrate 10 will be evenly etched and a uniform gate recess 16 will be created even if an over-etch occurs. The exposed portion of the STI region 12 will also be etched forming depressions 17. The depressions 17 in the STI region 12 will provide for future interconnection to the gate electrode.

Referring now to FIG. 3, a pad oxide layer 18 comprised of silicon oxide is grown overlying the surface by conventional techniques with a thickness of between about 7.5 to 12.5 nm (10 nm nominal). This is followed by a deposition of a silicon nitride layer 20 with a thickness of between about 180 to 220 nm (200 nm nominal) by conventional techniques. This will fill the gate recess 16 with the silicon nitride layer 20.

Referring now to FIG. 4, the top surface is planarized using etch-back (preferably) with a chemistry Of $CHF_3/CF_4$, for example, using the pad oxide layer 18 as an etch stop. Alternately, chemical mechanical polishing (CMP) may be used to planarize the surface and expose the pad oxide layer 18. Referring now to FIG. 5, additional oxide is grown causing the exposed pad oxide layer 18 to thicken by between about 15 to 25 nm (20 nm nominal). Referring now to FIG. 6, the silicon nitride layer 20 is partially etched using a wet chemistry of $H_3PO_4$, for example. The remaining thickness of the silicon nitride layer 20 will be between about 5 to 20 nm (10 nm nominal). This partially opens the gate recess 16.

Referring now to FIG. 7, additional oxide is grown causing the pad oxide layer 18 to further thicken by between about 15 to 25 nm (20 nm nominal). This results in a tapering (progressively thicker toward the top) of the pad oxide layer 18 along the sidewall of the gate recess 16. Thereafter, the remaining silicon nitride layer 20 is wet etched using a chemistry of $H_3PO_4$, for example. Threshold adjust and punch-through implantation 22 is performed. For an NMOS transistor, the implantation 22 uses boron ions with an energy of between about 5 to 20 keV with a dose of between about $10^{12}$ to $10^{13}$ atoms/cm$^2$. Alternately, for a PMOS transistor, phosphorous ions with an energy of between about 30 to 60 keV with a dose of between about $10^{12}$ to $10^{13}$ atoms/cm$^2$ are used for the implantation 22. A 0° tilt angle is used to ensure that there is minimal spreading of the implanted ions to areas under the future S/D regions. The two-step oxide growth yielding the tapered pad oxide layer 18 along the sidewall of the gate recess 16 will decrease the gate to S/D capacitance. In addition, it provides a thicker oxide mask protecting S/D regions during threshold adjust and punch-through implantations 22.

Referring now to FIG. 8, the pad oxide layer 18 is isotropically etched by a wet clean using RCA solution to remove the pad oxide layer 18 on the bottom of the gate recess 16. Gate dielectric 26 is grown by dry oxidation in an $HCl/N_2O/N_2O/N_2O_2/NH_3$ ambient, for example, to a thickness of between about 2 to 5 nm (4 nm nominal). Gate polysilicon 28 is then deposited by conventional techniques to a thickness of between about 180 to 220 nm (200 nm nominal) covering the surface and filling the gate recess 16.

Referring now to FIG. 9, the top surface is again planarized using CMP (preferable) and/or etch-back with a chemistry of HBr/Cl$_2$/HeO$_2$, for example, to expose the top of the substrate 10 and complete the gate structure. Screen oxide 30 is then deposited by conventional techniques to a thickness of between about 5 to 10 nm (5 nm nominal).

Referring now to FIG. 10, in an NMOS device lightly doped S/D implantations (not shown) of phosphorous ions with energy of between about 5 to 20 keV and a dose of between about 10$^{13}$ to 10$^{14}$ atoms/cm$^2$ are performed forming the lightly doped S/D regions 34. This is followed by the heavily doped S/D implantations (not shown) of arsenic with energy of between about 5 to 20 keV and a dose of between about 10$^{14}$ to 10$^{15}$ atoms/cm$^2$ forming the heavily doped S/D regions 36. Both the lighter and heavier implantations use a tilt angle of +/−15° for NMOS devices. Alternately for a PMOS transistor, boron ions with energy of between about 1 to 5 keV and a dose of between about 10$^{13}$ to 10$^{14}$ atoms/cm$^2$ would be used to form the lightly doped S/D regions 34. The heavily doped S/D implantation would use boron ions with energy of between about 1 to 5 keV and a dose of between about 5×10$^{14}$ to 5×10$^{15}$ atoms/cm$^2$ forming the heavily doped S/D regions 36. Both the lighter and heavier implantations use a tilt angle of +/−7° tilts for the PMOS device. The tilt angle for the implantations ensure that the S/D series resistances are sufficiently low. Thereafter, rapid thermal annealing (RTA) is performed at between about 900 to 1050° C. for 10 to 40 seconds to activate the implanted ions. The lightly doped S/D region 34 and heavily doped S/D region 36 form the double implanted drain (DID) structure. This is contrasted with conventional DID structures formed using lateral diffusion.

Referring now to FIG. 11, an inter-electrode dielectric layer 38 composed of boro-phospho silicate glass (BPSG), for example, is deposited by conventional techniques covering the top surface. It is then re-flowed for planarization where it merges with the screen oxide 30. Contact holes 40 are then patterned in the screen oxide/dielectric layer 30/38 by conventional techniques.

Referring now to FIG. 12, a metalization layer 42, composed of aluminum, for example, is deposited overlying the top surface and filling the contact holes 40 and then patterned by conventional techniques. A passivation layer 44 is then deposited by conventional techniques, completing the fabrication of the NMOS transistor device.

The present invention describes a method where a recessed gate structure is formed on a MOS transistor. This device is self-aligning, and has no degradation of operating performance. In addition to alleviating short-channel and hot-carrier effects associated with conventional planar MOSFETs, this structure provides excellent electrical characteristics due to the alignment of the threshold/punch-through implantation and the S/D implantations. By reducing gate to source and drain capacitances, and substrate to source and drain capacitances, dynamic performance is equivalent to conventional planar devices.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
    providing a semiconductor substrate;
    providing an active region on said semiconductor substrate contained by an isolation region;
    growing a mask oxide layer overlying said substrate and said isolation region;
    patterning said mask oxide layer forming an opening exposing said substrate within said active region;
    anisotropically etching a gate recess into said semiconductor substrate below said opening in said mask oxide layer, whereby said mask oxide layer is eroded away during said etching of said gate recess and a portion of said isolation region is removed;
    growing a pad oxide layer over said gate recess, said isolation region, and said semiconductor substrate;
    depositing a nitride layer overlying said pad oxide layer and filling said gate recess;
    planarizing said nitride layer to expose said pad oxide layer and top of said nitride layer filling said gate recess;
    growing a first overlap oxide layer on said pad oxide layer;
    partially etching away said nitride layer within said gate recess thereby exposing said pad oxide lining sidewalls of said gate recess;
    growing a second overlap oxide layer on said pad oxide layer and said first overlap oxide layer thereby thickening said pad oxide lining sidewalls of said gate recess;
    etching away said nitride layer remaining within said gate recess;
    implanting threshold adjusting ions through said pad oxide layer at bottom of said gate recess and into said substrate below said gate recess, whereby said pad oxide lining sidewalls and said first and second overlap oxide layers function as a mask for said threshold adjusting ions;
    isotropically etching away said pad oxide layer on said bottom of said gate recess exposing said substrate at said bottom of said gate recess;
    growing a gate dielectric layer overlying said substrate at said bottom of said gate recess and said second overlap oxide;
    depositing a polysilicon gate layer overlying said gate dielectric layer and filling said gate recess;
    planarizing said polysilicon gate layer to expose said top of said gate recess, said substrate and said isolation region thereby forming the gate structure comprised of said polysilicon gate layer, said gate dielectric layer, said pad oxide layer, said first overlap oxide layer and said second overlap oxide layer;
    depositing a screen oxide layer overlying said substrate, said isolation region and said gate structure;
    forming a double implanted drain (DID) structure by implanting a light dosage of ions forming lightly doped source and drain (S/D) regions of said DID structure and thereafter implanting a heavy dosage of ions forming heavily doped source and drain (S/D) regions of said DID structure;
    annealing said DID structure;
    depositing an inter-electrode dielectric layer overlying said substrate, said isolation region and said gate structure;
    etching contact holes in said inter-electrode dielectric layer to expose said polysilicon gate layer and said heavily doped S/D regions of said DID structure;
    depositing a metalization layer overlying said inter-electrode dielectric layer and filling said contact holes;
    patterning said metalization layer to form conductive lines; and
    depositing a passivation layer thereby completing fabrication of said integrated circuit device.

2. The method according to claim 1 wherein said semiconductor substrate is p-type silicon with crystal orientation of <100>.

3. The method according to claim 2 wherein said implantation of said threshold adjusting ions is achieved using boron ions with an energy of between about 5 to 20 keV with a dose of between about $10^{12}$ to $10^{13}$ atoms/cm$^2$ at a tilt angle of 0°.

4. The method according to claim 2 wherein said implantation of said light dosage of ions is achieved using phosphorous ions with an energy of between about 5 to 20 keV with a dose of between about $10^{13}$ to $10^{14}$ atoms/cm$^2$ at a tilt angle of +/−15°.

5. The method according to claim 2 wherein said implantation of said heavy dosage of ions is achieved using arsenic ions with an energy of between about 5 to 20 keV with a dose of between about $10^{14}$ to $10^{15}$ atoms/cm$^2$ at a tilt angle of +/−15°.

6. The method according to claim 1 wherein said semiconductor substrate is n-type silicon with crystal orientation of <100>.

7. The method according to claim 6 wherein said implantation of said threshold adjusting ions is achieved using phosphorous ions with an energy of between about 30 to 60 keV with a dose of between about $10^{12}$ to $10^{13}$ atoms/cm$^2$ at a tilt angle of 0°.

8. The method according to claim 6 wherein said implantation of said light dosage of ions is achieved using boron ions with an energy of between about 1 to 5 keV with a dose of between about $10^{13}$ to $10^{14}$ atoms/cm$^2$ at a tilt angle of +/−7°.

9. The method according to claim 6 wherein said implantation of said heavy dosage of ions is achieved using boron ions with an energy of between about 1 to 5 keV with a dose of between about $5\times10^{14}$ to $5\times10^{15}$ atoms/cm$^2$ at a tilt angle of +/−7°.

10. The method according to claim 1 wherein said isolation region comprises silicon oxide having a depth of between about 300 to 500 nm.

11. The method according to claim 1 wherein said etching of said gate recess is achieved using SF$_6$ chemistry resulting in a final depth of said gate recess of between about 95 to 105 nm.

12. The method according to claim 1 wherein said first overlap oxide layer comprises silicon oxide having a thickness of between about 15 to 25 nm.

13. The method according to claim 1 wherein said partial etching of said nitride layer is achieved using a wet etch chemistry of H$_3$PO$_4$ and has a target thickness of said nitride layer after said partial etching of between about 5 to 20 nm.

14. The method according to claim 1 wherein said second overlap oxide layer is comprised of silicon oxide having a thickness of between about 15 to 25 nm.

15. The method according to claim 1 wherein said thickening of said pad oxide lining sidewalls of said gate recess results in said pad oxide lining sidewalls to be tapered such that said pad oxide lining said sidewalls is thicker near the top of said gate recess.

16. The method according to claim 1 wherein said annealing said DID structure is achieved by rapid thermal annealing (RTA) at a temperature of between about 900 to 1050° C. for between about 10 to 40 seconds.

17. The method according to claim 1 wherein said pad oxide lining sidewalls of said gate recess separates said gate structure from said DID structure.

18. A method of fabricating an integrated circuit device comprising:
providing a semiconductor substrate;
providing an active region on said semiconductor substrate contained by an isolation region;
growing a mask oxide layer overlying said substrate and said isolation region;
patterning said mask oxide layer forming an opening exposing said substrate within said active region;
anisotropically etching a gate recess into said semiconductor substrate below said opening in said mask oxide layer, whereby said mask oxide layer is eroded away during said etching of said gate recess and a portion of said isolation region is removed;
growing a pad oxide layer over said gate recess, said isolation region, and said semiconductor substrate;
depositing a nitride layer overlying said pad oxide layer and filling said gate recess;
planarizing said nitride layer to expose said pad oxide layer and top of said nitride layer filling said gate recess;
growing a first overlap oxide layer on said pad oxide layer;
partially etching away said nitride layer within said gate recess thereby exposing said pad oxide lining sidewalls of said gate recess;
growing a second overlap oxide layer on said pad oxide layer and said first overlap oxide layer thereby thickening said pad oxide lining sidewalls of said gate recess and causing said pad oxide lining sidewalls to be tapered such that said pad oxide lining said sidewalls is thicker near the top of said gate recess;
etching away said nitride layer remaining within said gate recess;
implanting threshold adjusting ions through said pad oxide layer at bottom of said gate recess and into said substrate below said gate recess at a tilt angle of 0°, whereby said pad oxide lining sidewalls and said first and second overlap oxide layers function as a mask for said threshold adjusting ions;
isotropically etching away said pad oxide layer on said bottom of said gate recess exposing said substrate at said bottom of said gate recess;
growing a gate dielectric layer overlying said substrate at said bottom of said gate recess and said second overlap oxide;
depositing a polysilicon gate layer overlying said gate dielectric layer and filling said gate recess;
planarizing said polysilicon gate layer to expose said top of said gate recess, said substrate and said isolation region thereby forming the gate structure comprised of said polysilicon gate layer, said gate dielectric layer, said pad oxide layer, said first overlap oxide layer and said second overlap oxide layer;
depositing a screen oxide layer overlying said substrate, said isolation region and said gate structure;
forming a double implanted drain (DID) structure by implanting a light dosage of ions forming lightly doped source and drain (S/D) regions of said DID structure and thereafter implanting a heavy dosage of ions forming heavily doped source and drain (S/D) regions of said DID structure, whereby said pad oxide lining sidewalls of said gate recess separates said gate structure from said DID structure;
annealing said DID structure;

depositing an inter-electrode dielectric layer overlying said substrate, said isolation region and said gate structure;

etching contact holes in said inter-electrode dielectric layer to expose said polysilicon gate layer and said heavily doped S/D regions of said DID structure;

depositing a metalization layer overlying said inter-electrode dielectric layer and filling said contact holes;

patterning said metalization layer to form conductive lines; and depositing a passivation layer thereby completing fabrication of said integrated device.

19. The method according to claim 18 wherein said isolation region comprises silicon oxide having a depth of between about 300 to 500 nm.

20. The method according to claim 18 wherein said etching of said gate recess is achieved using $SF_6$ chemistry resulting in a final depth of said gate recess of between about 95 to 105 nm.

21. The method according to claim 18 wherein said pad oxide layer comprises silicon oxide having a thickness of between about 7.5 to 12.5 nm.

22. The method according to claim 18 wherein said nitride layer comprises silicon nitride, having a thickness of between about 180 to 220 nm.

23. The method according to claim 18 wherein said first overlap oxide layer comprises silicon oxide having a thickness of between about 15 to 25 nm.

24. The method according to claim 18 wherein said partial etching of said nitride layer is achieved using a wet etch chemistry of $H_3PO_4$ and has a target thickness of said nitride layer after said partial etching of between about 5 to 20 nm.

25. The method according to claim 18 wherein said second overlap oxide layer is comprised of silicon oxide having a thickness of between about 15 to 25 nm.

26. The method according to claim 18 wherein said polysilicon layer is deposited to a thickness of between about 180 to 220 nm.

27. The method according to claim 18 wherein said planarization of said polysilicon layer is achieved using chemical mechanical polishing.

28. The method according to claim 18 wherein said annealing said DID structure is achieved by rapid thermal annealing (ETA) at a temperature of between about 900 to 1050° C. for between about 10 to 40 seconds.

* * * * *

UNITED STATES PATENT AND TRADEMARK OFFICE
CERTIFICATE OF CORRECTION

PATENT NO. : 7,091,092 B2 Page 1 of 1
APPLICATION NO. : 10/062227
DATED : August 15, 2006
INVENTOR(S) : Sreedharan Pillai Sreelal et al.

It is certified that error appears in the above-identified patent and that said Letters Patent is hereby corrected as shown below:

Title page Inventors (75), should read --Sreedharan Pillai Sreelal, Francis Yong Wee Poh, James Yong Meng Lee --.

Signed and Sealed this

Twelfth Day of December, 2006

JON W. DUDAS
*Director of the United States Patent and Trademark Office*

UNITED STATES PATENT AND TRADEMARK OFFICE
CERTIFICATE OF CORRECTION

PATENT NO.          : 7,091,092 B2
APPLICATION NO.     : 10/062227
DATED               : August 15, 2006
INVENTOR(S)         : Sreedharan Pillai Sreelal et al.

It is certified that error appears in the above-identified patent and that said Letters Patent is hereby corrected as shown below:

In the inventors, (75), delete "Sneedharan Pillai Sneelal , Trivandrum (IN): Francis Poh, Singapore (SG): James Lee, Singapore (SG); Alex See, Singapore (SG); C. K. Lau, Singapore (SG); Ganesh Shankar Samudra, Singapore (SG)" and replace with -- Sreedharan Pillai Sreelal, Tivandrum (IN); Francis Yong Wee Poh, Singapore (SG); James Yong Meng Lee, Singapore (SG); Alex See, Singapore (SG); C.K. Lau, Singapore (SG); Ganesh Shankar Samudra, Singapore, (SG) --.

Signed and Sealed this

Twentieth Day of March, 2007

JON W. DUDAS
*Director of the United States Patent and Trademark Office*